(12) United States Patent
Lutz et al.

(10) Patent No.: US 11,218,984 B1
(45) Date of Patent: Jan. 4, 2022

(54) FIXED-BEACON TIME TRANSFER SYSTEM

(71) Applicant: SiTime Corporation, Santa Clara, CA (US)

(72) Inventors: Markus Lutz, Mountain View, CA (US); Sassan Tabatabaei, Sunnyvale, CA (US); Charles I. Grosjean, Los Gatos, CA (US); Paul M. Hagelin, Saratoga, CA (US); Aaron Partridge, Cupertino, CA (US)

(73) Assignee: SiTime Corporation, Sunnyvale, CA (US)

( * ) Notice: Subject to any disclaimer, the term of this patent is extended or adjusted under 35 U.S.C. 154(b) by 162 days.

(21) Appl. No.: 16/655,560

(22) Filed: Oct. 17, 2019

Related U.S. Application Data

(60) Provisional application No. 62/747,593, filed on Oct. 18, 2018.

(51) Int. Cl.
| | |
|---|---|
| *H04W 56/00* | (2009.01) |
| *H04W 40/24* | (2009.01) |
| *B81B 7/02* | (2006.01) |
| *G06F 7/58* | (2006.01) |
| *H04W 88/08* | (2009.01) |

(52) U.S. Cl.
CPC .......... *H04W 56/0015* (2013.01); *B81B 7/02* (2013.01); *G06F 7/582* (2013.01); *H04W 40/244* (2013.01); *H04W 88/085* (2013.01)

(58) Field of Classification Search
CPC ... H04W 88/085; H04W 56/0015; B81B 7/02
See application file for complete search history.

(56) References Cited

U.S. PATENT DOCUMENTS

| | | | | |
|---|---|---|---|---|
| 8,090,379 | B2* | 1/2012 | Lambert | H04W 88/04 455/446 |
| 9,565,645 | B1* | 2/2017 | Burford | H04W 56/006 |
| 2011/0216660 | A1* | 9/2011 | Lee | H04W 56/0015 370/252 |
| 2012/0219041 | A1* | 8/2012 | Lindoff | H04W 56/0045 375/219 |
| 2016/0112974 | A1* | 4/2016 | Shenoi | H04W 56/009 370/350 |
| 2017/0150464 | A1* | 5/2017 | Kazehaya | H04B 7/269 |
| 2018/0288718 | A1* | 10/2018 | Bal | H04W 56/0015 |

\* cited by examiner

*Primary Examiner* — Ricardo H Castaneyra

(57) ABSTRACT

In various time-transfer systems, one or more fixed-position time beacons broadcast radio-frequency (RF) time-transfer messages to time-keeping modules disposed in remote radio heads and other strategic locations to achieve highly reliable and accurate synchronized time, phase, and frequency transfer over a metropolitan or other wide-field area.

18 Claims, 3 Drawing Sheets

FIXED-BEACON TIME TRANSFER SYSTEM

CROSS REFERENCE TO RELATED APPLICATIONS

Figure 1:
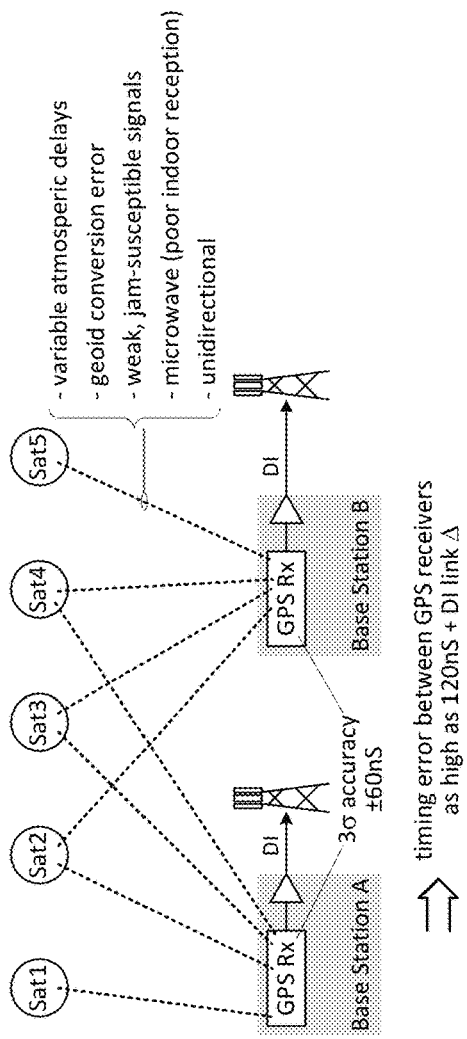
Figure 1:
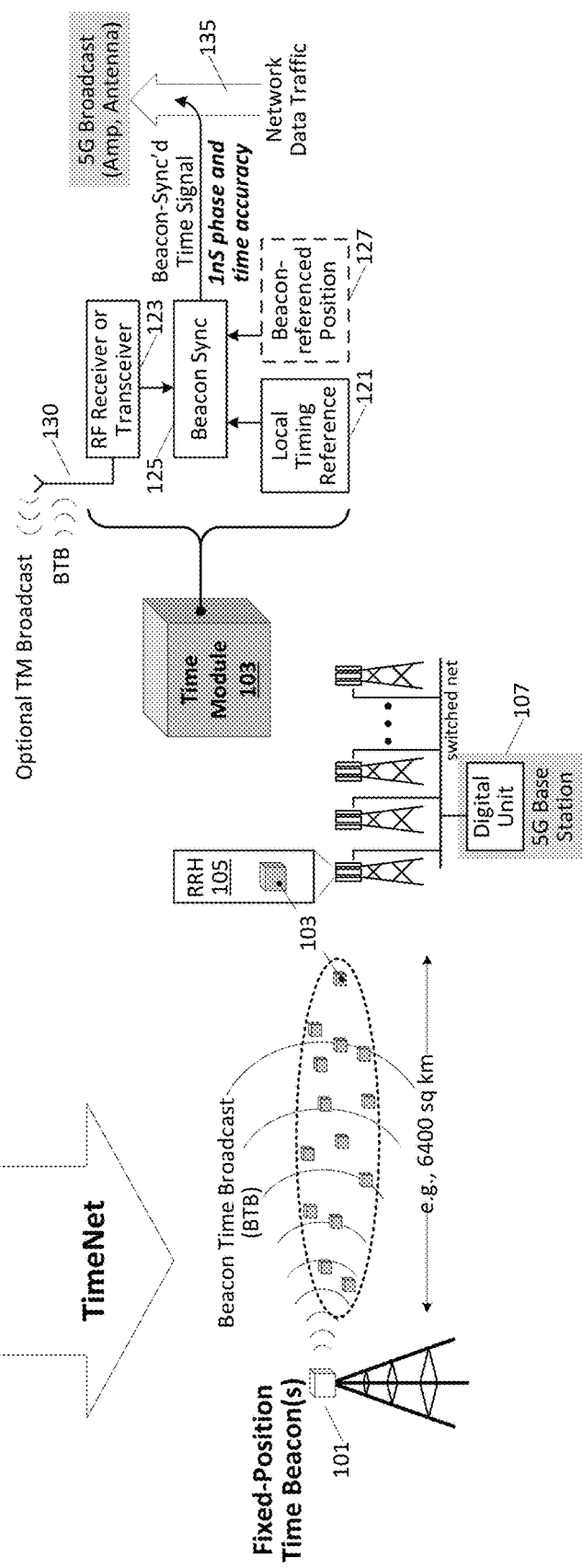

This application hereby claims priority to and incorporates by reference U.S. provisional application No. 62/747,593 filed Oct. 18, 2018.

TECHNICAL FIELD

The disclosure herein relates to wide area time, phase and/or frequency synchronization.

DRAWINGS

Figure 2:
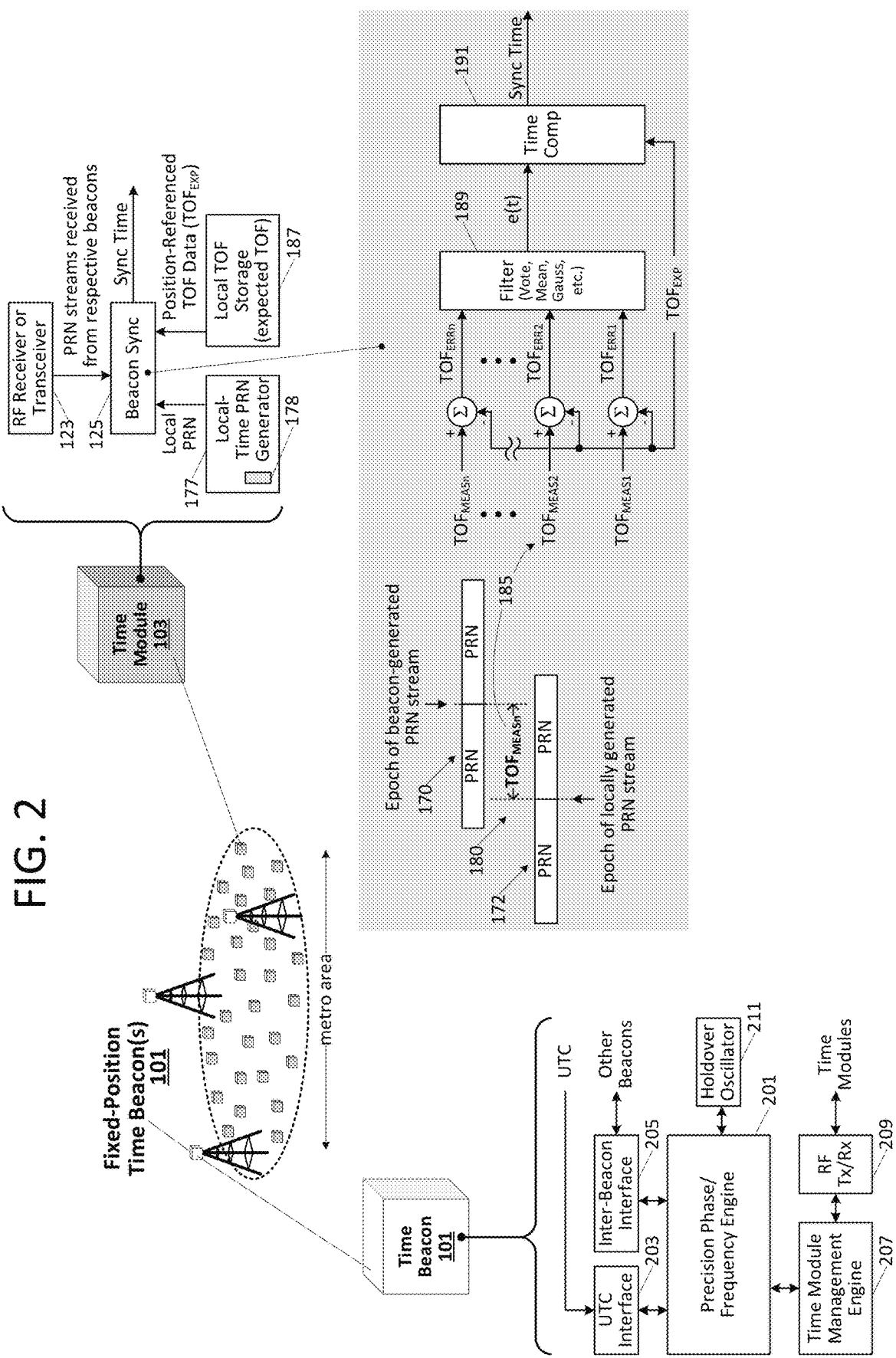
Figure 3:
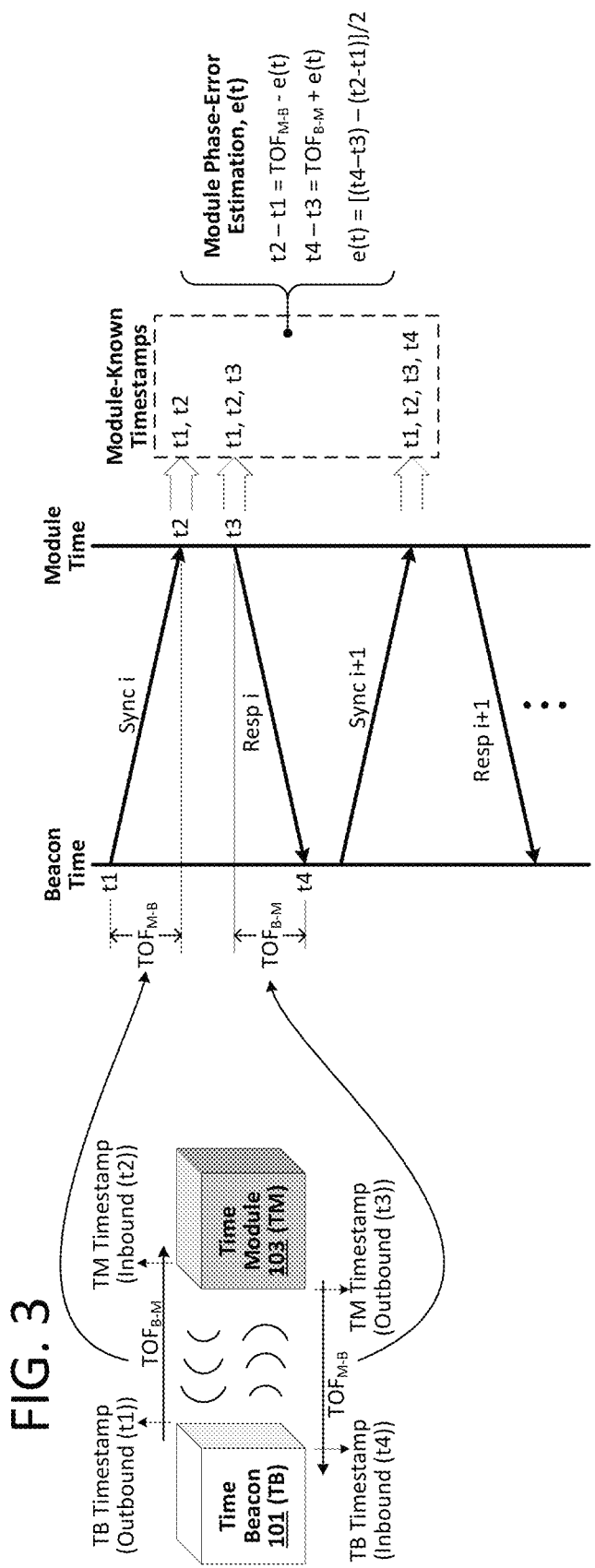

The various embodiments disclosed herein are illustrated by way of example, and not by way of limitation, in the figures of the accompanying drawings and in which like reference numerals refer to similar elements and in which:

FIG. 1 contrasts a conventional GPS-satellite-based time-transfer deployed in 4G broadband cellular networks with a fixed-position time beacon approach deployed, for example and without limitation, in a 5G broadband cellular network;

FIG. 2 presents more detailed embodiments of time beacon and time module components of a fixed-beacon time transfer system; and FIG. 3 illustrates an exemplary timing synchronization effected within the time module based on four-way time-stamping of signals transmitted in each direction between a time beacon and time module.

DETAILED DESCRIPTION

In various time-transfer systems disclosed herein, one or more fixed-position time beacons broadcast radio-frequency (RF) time-transfer messages to time-keeping modules disposed in remote radio heads and other strategic locations to achieve highly reliable and accurate synchronized time, phase, and frequency transfer over a metropolitan or other wide-field area. Because of the relatively high barrier penetration achieved by the RF time-transfer message transmission (i.e., in contrast to microwave transmissions from global-positioning-system (GPS) satellites, for example), the time-keeping modules may be disposed indoors or other areas lacking a direct line-of-sight to the transmission source. Also, time-of-flight delays (i.e., delays in RF signal propagation) resulting from building walls or other fixed structures between a given time beacon and time module tend to be static/systemic and thus may be readily compensated by one-time or occasional calibration. Accordingly, many of the variable time-of-flight delays that limit timing accuracy in conventional GPS-based time transfer systems (i.e., atmospheric delays, satellite motion compensation, satellite switchover, time-varying barrier-penetration latency and so forth) are avoided altogether, enabling time transfer accuracy orders of magnitude beyond that of conventional systems. Moreover, only a small number of relatively low cost, maintenance-accessible time beacons (as few as one) are required to support many hundreds, thousands (or more) low cost time modules, dramatically lowering deployment and operating cost relative to satellite-based time transfer systems. Also, bidirectional messaging is implemented between a given time beacon and time module in a number of embodiments, enabling beacon/module-coordinated determination of phase/frequency error to be applied within the time module, as well as rapid detection and reporting of error/failure, malicious attack, and so forth. These and other features and benefits of a fixed-beacon time transfer system are presented herein.

FIG. 1 contrasts a conventional GPS-satellite-based time-transfer deployed in 4G (fourth generation) broadband cellular networks with a fixed-position time beacon approach deployed, for example and without limitation, in a 5G broadband cellular network. Referring first to the conventional 4G approach, GPS receivers disposed in respective 4G base stations receive continuously transmitted microwave signals from orbiting satellites. The signals bear satellite time (from satellite-borne atomic clock) and position data that enable GPS receiver calculation of four unknown quantities—three position coordinates and local clock deviation from satellite time (i.e., those four unknowns being calculable so long as signals are received from at least four satellites). The local clock deviation is applied to recover/estimate the satellite time, which is forwarded, in turn, to an associated 4G antenna via a wired dedicated link ("DI"), nominally producing the satellite time at the antenna and thus at a network edge. Thus, in summary, a number of disadvantages are presented by a satellite-based (microwave GPS) time-transfer system: (1) while sufficient for 4G (1.5 µS) standard, such is still plagued by poor indoor reception, security risks (jamming/spoofing, etc.); and (2) such provides a marginal/insufficient migration path for reliable 5G (135 nS) technologies and beyond, particularly in view of 4G→5G transition to multiple antennas (10-20) per base station and replacement of dedicated base-to-antenna link (Dl) with variable-latency ethernet interconnection between digital unit (with GPS Rx) and antennas.

Although sufficient to meet the 1.5 µS 4G accuracy specification, GPS-based time-transfer suffers numerous shortcomings that render the system marginal/insufficient with respect to the 130 ns accuracy required by the next-generation 5G standard (e.g., time-of-flight dependence on time-varying atmospheric conditions and imperfect geoid modeling/compensation, imperfect or limited compensation for dedicated-link delay, poor microwave barrier penetration (and thus limited indoor/urban-canyon signal reception), susceptibility to jamming/spoofing, low signal to noise due low field strength, etc.). In general, the various error sources in 4G time-transfer limit the 3σ accuracy of a given base station to ±60 nanoseconds, meaning that the timing error between the two base-station GPS receivers depicted in FIG. 1 may be as high as 120 ns (3σ), before accounting for timing error due to propagation delay from base station to antenna over the dedicated link. Moreover, timing limitations of the 4G GPS approach are exacerbated by additional complexities of the 5G standard, particularly the proliferation of antennas from one (or a small number) to 10-20 per base station and the replacement of the dedicated base-to-antenna link with a switched network (e.g., Ethernet or other LAN) characterized by time-varying signal propagation delay.

Under the fixed-position RF time beacon approach—referred to herein as "TimeNet" as shown in FIG. 1—critical error sources and operational limitations that plague the GPS system may be avoided altogether. In particular, the fixed tropospheric position of the time beacon (101) yields a precise and highly repeatable time-of-flight with respect to signal broadcast to a given time-module (103), minimizing atmospheric effects and obviating error prone geodic compensation and other complex calculations required to compensate orbital motion. Also, transmission of the beacon time broadcast (BTB) in the RF spectrum yields dramatically improved barrier penetration, enabling indoor and urban signal reception and thus less constrained disposition of time modules within and between buildings. Optional bidirectional transmission (from beacon 101 to time module 103 and vice-versa) enables two-way time stamping to support ongoing calibration, fine-error compensation, failure detection, loss-of-sync detection, authentication, health/status information, security attack and so forth. The fixed-position becon system depicted in FIG. 1 presents a number of advantages: (A) beacon time is broadcast over the RF spectrum, enabling much better barrier presentation and indoor reception; (B) multiple time beacons may be provided to enable reduncancy, enhanced security and robustness (e.g., they are less easily jammed/spoofed); (C) two or more (or all) time beacons may be synchronized; (D) time beacons may be used to form a meshed network, with each time beacon communicating with two or more other time beacons; and (E) multiple time beacons may be leveraged to generate a correction map.

The fixed-position time beacons 101 themselves may be implemented/maintained at relatively low cost and deployed in on pre-existing towers or buildings to service a wide area (e.g., a 50-mile by 50-mile area and thus a large metropolitan area). Although a single time beacon may suffice (and increase economic feasibility in areas of low population density), a relatively small number of time beacons (e.g., two to five) may be deployed in a given service area to provide redundancy, fault detection, and enhanced security (e.g., less easily jammed or spoofed). In that case, any or all of the time beacons may be synchronized to each other to improve timing accuracy over the time-transfer service area. For example, time beacons 101 may be interconnected via a wired or wireless meshed network in which each time beacon communicates time and environmental parameters (e.g., windspeed, atmospheric temperature, barometric pressure, beacon displacement due to tower or building sway, etc.) to two or more other time beacons—information applied within the time beacons to generate individual or shared compensation maps and thereby enable compensation for nanosecond or sub-nanosecond time variations.

Still referring to the fixed-beacon TimeNet approach shown in FIG. 1, time modules 103 may be randomly dispersed within the time-beacon broadcast area (i.e., such that at least one time module is located 5, 10, 25, 50 or more miles in respective orthogonal directions from two other time modules to define an area), including indoors or within buildings or housings not readily penetrable by microwave GPS signals. In the particular embodiment shown, some or all time modules 103 are disposed within the remote radio head 105 (RRH) of a 5G broadband cellular network (or earlier or later generation network), thereby obviating compensation for time-varying transmission delays between the base-station digital unit 107 (DU) and RRH. The remote radio head itself may be implemented as part of a pre-existing cellular antenna tower or may be disposed indoors or other locations generally impracticable for legacy time-transfer systems. A relatively low-cost local clocking architecture may be implemented within each time module 103 with per-beacon time-of-flight delay determined (measured and/or calculated, including accounting for barrier delay) and recorded at time of deployment (e.g., stored in nonvolatile storage component of the time module). In a number of embodiments, for example, a temperature compensated crystal oscillator (TCXO), oven-controlled crystal oscillator (OCXO), temperature-compensated microelectromechanical systems oscillator (TC MEMS) or oven-controlled MEMS oscillator (OC MEMS) may serve as a precision local timing reference 121 (local clock) for a given time module 103, being deployed therein together with an RF receiver (or transceiver) 123, beacon synchronization logic 125, and optional beacon-referenced position storage 127. Compared to microwave antenna's deployed in precision GPS solutions, RF antennas 130 used in time modules 103 can be much simpler and less expensive due to the stronger RF signals. In networks having a single time beacon 101, beacon synchronization logic 125 may slave the local time to the beacon time, determining timing error and updating a timing compensation control accordingly—ultimately applying the beacon-synchronized timing information to time transmission of the network traffic stream 135 (i.e., network control and data traffic) at or near the point of broadcast. For example, in the case of a time-division-multiplexed (TDM) network traffic transmission (such as in LTE (Long-Term Evolution) or 5G network), the beacon-synchronized timing information may be used to define traffic time slots with specified accuracy (e.g., marking the edges of those slots and thus multiplexer switching time) and thereby synchronize traffic time slots across geographically distributed cells within a cellular network area. In the case of MIMO (Multiple-Input Multiple-Output) technology, the beacon-synchronized timing information may be applied to time/phase-synchronize simultaneous data transmission events and/or simultaneous data reception/sampling events within the multiple transmitters/receivers of a MIMO implementation. The beacon-synchronized timing information may also be applied to synchronize wireless carriers in frequency and/or phase across transmitters within a given radio tower and/or set of towers at geographically distributed locations within a cellular network (e.g., enabling periodic phase and/or frequency adjustment of individual carrier waves generated within the cellular network).

For multi-beacon time-transfer systems, beacon synchronization logic 125 may reconcile timing discrepancy between two or more time beacons 101 by any practicable statistical, algorithmic and/or heuristic approach—for example, discarding outlier data before determining a statistical median or mean, choosing a predominantly indicated timing correction in a voting arrangement, etc. In time modules having an RF transceiver 123 (i.e., capable of bidirectional information exchange with respect to a time beacon and/or other time module—as opposed to a receiver-only implementation), four-way time-stamping may be executed to enable beacon/module-coordinated timing compensation and error/failure detection. In addition to enabling improved timing accuracy, those timestamps and/or other bidirectional information exchange between time beacon 101 and time module 103 (and/or between two time modules 103) may be employed for improved security (enabling coordinated intrusion/attack detection), network status monitoring and reporting, etc.

Still referring to FIG. 1, beacon synchronization circuitry 123 and precision local timing reference 121 yield, in at least some embodiments, a time-transfer and frequency/phase accuracy of ~1 ns or better at the 5G remote radio head, exceeding the 130 ns 5G accuracy specification by more than two orders of magnitude and providing headroom for future-generation time-transfer requirements. In such embodiments, time beacons 101 employ extremely precise reference clocks (e.g., atomic clocks) and related circuitry (integer or fractional-N phase-locked loops (PLLs)) to yield clock signals oscillating, for example, 10 GHz or higher to enable phase/frequency adjustment (or compensation) with tenth nanosecond (0.1 nS) granularity or finer within individual time modules 103. Thus, in summary, the use of one or more time modules 103 presents a number of advantages, including: (A) disposal at an antenna/RRH, thereby obviating error-prone base-to-antenna latency compensation; (B) disposal indoors, e.g., in an "urban canyon," etc.; (C) static delay (systematic delay, e.g., signal propagation delay due to intervening structure)) can be subject to one-time compensation; (D) time-module may be broadcast, permitting four-way time stamping, use of a mesh network, etc.; (E) a low-cost architecture with precision local timing reference (e.g., TCXO, OCXO, TC MEMS or OC MEMS in combination with RF receiver/transceiver and synchronization logic); and (F) beacon-time reconciliation by vote or other statistical approach in view of known/fixed distance to each beacon.

The fixed-beacon time transfer system of FIG. 1 may vary in numerous regards. For example, while generally described herein as stationary devices, time modules 103 may be mobile relative to the fixed beacons (e.g., disposed in an automobile, drone, aircraft, train, watercraft or any other mobile device) and/or may be subject to occasional movement as in the case of a table-top, desktop, handheld or body-worn device. Additionally, despite the signal reception benefits of RF spectrum time-beacon transmission and expected deployment with transmission frequency between 100 MHz and 900 MHz, time beacons 101 may alternatively or additionally transmit signals in microwave spectrum—generally, any transmission frequency between 100 KHz and 5 GHz or higher frequency may be employed. Further, the beacon-based time transfer may be applied in connection with numerous applications including, without limitation, precision localization (i.e., identifying locus of object, person, etc. within 30 centimeters or less), indoor navigation, industrial automation, TOT (internet of things) synchronization, automotive operation (including self-drive and GPS back-up), finance/banking application (e.g., in connection with securities exchange and/or other electronic trading), power-grid load balancing and operation, tracking and/or attitude sensing, broadcasting, networking (synchronization and/or timestamping), cloud/server infrastructure and so forth.

FIG. 2 presents more detailed embodiments of time beacon and time module components of a fixed-beacon time transfer system. In the depicted example, each time beacon 101 generates and broadcasts one or more beacon-clock-synchronized pseudorandom number (PRN) streams each having an identifiable epoch as shown at 170, and each time module 103 also self-generates nominally the same PRN stream (172) synchronously with the locally generated clock (i.e., within a local-time PRN generator 177 having, for example, a MEMS based timing reference 178—MEMS oscillator, temperature-compensated oscillator or oven-controlled oscillator—or any other practicable timing reference in view of performance requirements). The beacon synchronization circuitry 125 receives the local PRN (from local-time PRN generator 177) and the PRN streams broadcast by respective time beacons (i.e., received via RF receiver/transceiver 123 as shown) and determines, as a time-of-flight measurement ($TOF_{MEAS}$), the timing offset between their respective epochs (i.e., as shown at 180). Referring to detail view 185, beacon synchronization circuitry 125 (e.g., hardwired digital processing logic and/or programmed processor(s)) generates timing error measurements according to differences between time of flight measurements from respective beacons ($TOF_{MEAS1}$, $TOF_{MEAS2}$, ..., $TOF_{MEASn}$) and an expected, locally stored (187) time-of-flight value (i.e., $TOF_{EXP}$—an expected TOF value and/or data for generating such expected TOF based on conditions at hand and pre-measured/calculated time-of-flight between beacon and module based at least in part on the fixed distance therebetween), supplying those error measurements ($TOF_{ERR1}$-$TOF_{ERRn}$) to filtering logic 189. Filtering logic 189 selectively combines the error measurements (e.g., excluding statistical outliers in an averaging operation or other filtering operation) to produce a finalized timing/phase error signal, e(t). As shown, the timing/phase error signal is supplied to a timing compensator 191 which responsively generates a synchronized time signal (Sync Time).

Note that the filtering operation shown in FIG. 2 is one of many possible approaches to synchronized time signal generation. For example, instead of (or in addition to) excluding outlier error measurements from the final timing error calculation, an accumulation of time-of-flight error measurements from each time beacon may be combined with those from other time beacons in a finite impulse response (FIR) or infinite impulse response (IIR) filtering operation. More generally, various alternative techniques (including alternative digital and/or analog circuitry) may be used to determine a compensable timing or phase error between a locally indicated time and a beacon-indicated time. As an example, the phase/frequency of a crystal oscillator or MEMS oscillator may be adjusted or pulled within a digitally controlled phase locked loop (e.g., a fractional-N PLL) until the PLL output is phase aligned with the beacon time.

Still referring to the FIG. 2 embodiment, each time beacon 101 includes, at its core, a precision phase/frequency engine 201 that maintains and outputs absolute beacon-time with sub-nanosecond accuracy (though time beacon phase/frequency engines may also or alternatively maintain beacon time with nanosecond accuracy or nanosecond+accuracy as required, for example, to meet application requirements) together with or as part of one or more PRN streams. In one embodiment, for example, a given time beacon 101 broadcasts a single PRN stream to be received by time modules 103 disposed within the broadcast range. In other embodiments, a time beacon 101 may simultaneously (or concurrently) transmit multiple PRN codes on respective/different carrier frequencies to allow, within individual time modules 103, filtering of multi-path or other transmission medium based delays which cause different delays because of different carrier frequencies.

Continuing with exemplary components of time beacon 101, a universal-time interface 203 receives UTC (Coordinated Universal Time) data from a UTC time standard, delivering that data to phase/frequency engine 201 to enable UTC-synchronization of the beacon time maintained therein. In a number of embodiments, the UTC interface is implemented by a GPS receiver, though additional or alternative interfaces to the UTC time standard may be provided. More generally, various other time standards (and interface circuitry therefor) may be used instead of or in addition to the UTC time standard.

An inter-beacon interface 205 exchanges time and status data (i.e., the latter including, for example and without limitation, state-of-health data, temperature/pressure/humidity and/or other environmental data, beacon identification data, etc.) with one or more other time beacons via wired and/or wireless signaling transceivers (e.g., wireless optical or RF signaling, free space optical, wired point-to-point or wired multi-drop, etc.), and a time module management engine 207 and RF transceiver 209 similarly enable time and status data exchange with time modules 103 disposed within the beacon broadcast area—transmitting the beacon time to (and managing) those time modules. An optional holdover oscillator 211 implemented, for example, by one or more MEMS based clocks, TCXO, OCXO, double oven OCXO, atomic clock, optical clock, etc. is provided as a reference for beacon-time holdover between synchronization intervals or in the event of reference data loss with respect to other beacons and/or the UTC time standard.

FIG. 3 illustrates an exemplary timing synchronization (and/or frequency or phase synchronization/alignment) effected within a time module 103 based on four-way time-stamping of signals transmitted in each direction between the time module 103 and a time beacon 101. As shown, time beacon 101 effects a first timestamp t1 synchronized to a beacon clock (e.g., in the form of an epoch-bearing pseudo random number stream or other data that indicates a particular timing edge/event within the beacon clock signal) with respect to an outbound transmission and time module 103 generates a second time stamp (t2) with respect to its local clock upon receiving the beacon transmission. Where the beacon and module clocks are exactly aligned, the difference between the two time stamps reflects the signal time-of-flight (and will/should match an expected time-of-flight if such value has been pre-recorded within the time module). By contrast, any misalignment (timing skew or timing phase/frequency error) between the beacon clock and module clock will increase or decrease the timestamp difference relative to the true time of flight. Conversely, timestamps generated by the time module upon return transmission by the time module (t3) and reception at the time beacon (t4) will differ by the reverse of the beacon-to-module timestamp difference. That is, assuming the true time-of-flight from beacon to module ($TOF_{B-M}$) matches the true time of flight in the reverse direction from module to beacon ($TOF_{M-B}$), the phase error, e(t), between the beacon and module clocks may be estimated by halving the difference between the two timestamp differences (i.e., e(t)=[(t4−t3)−(t2−t1)]/2). In cases of asymmetric flight times (i.e., $TOF_{B-M}<>TOF_{M-B}$), fixed asymmetry (error) may be determined and compensated based on expected time-of-flight data captured at module installation. Time-varying $TOF_{B-M}/TOF_{M-B}$ asymmetry caused, for example, by beacon and/or module motion (e.g., tower or building sway) may be detected using inertial sensors and the like and adjusting the time stamper used for the outbound/inbound signals. Redundant/multiple beacons will also enable a given time module to detect timing error with respect to a single beacon (e.g., swaying thereof). Further, beacon-specified timing phase (i.e., inhering in a timestamp difference) may be filtered within the time module with a time constant of multiple seconds to tens or hundreds of seconds, thus eliminating sway-induced timing error. Digital processing techniques may also be used to determine a sway frequency with respect to beacon-specified timing followed by application of a notch or low-pass filter configured to block the sway component.

Flight time delays caused by reflections or barrier penetration (ground, buildings, hills, . . . ) can be compensated during installation of time modules 103 by carrying a precise absolute clock during installation. Multiple beacons generate redundancy and multiple possible solutions because of the known fixed locations. This also can be used to compensate for time-of-flight variance between a given time module 103 and time beacon 101. Additionally, each time beacon may self-identify and compensate for flight time variation due to wind (sway), temperature or other local disturbance, sharing this information with other beacons and time modules located nearby or along a given path of transmission (i.e., other system components likely subject to the same disturbance). In those cases, a three-dimensional (3D) compensation map may be generated within a given beacon and/or time module based on the flight-time-variation factors and, in a bidirectional system, remotely generated timestamps.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific communication protocols, interconnect topologies, sensor implementations, component elements and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). References to time synchronization should be understood to include frequency and/or phase synchronization (or alignment) and vice-versa. The term "coupled" is used herein to express a direct connection as well as a connection through one or more intervening functional components or structures. Device configuration or programming can include, for example and without limitation, loading a control value into a register or other storage circuit within an integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A time transfer system comprising:
  a time beacon disposed at a fixed terrestrial position to broadcast a radio-frequency time-transfer signal; and
  a plurality of time modules dispersed over a wide-field area spanned by the time-transfer signal broadcast, the plurality of time modules including a first time module mounted to a remote radio head of a cellular network antenna tower, the first time module having circuitry to receive the radio-frequency time-transfer signal, generate timing information based at least in part on the radio-frequency time-transfer signal, and time transmission of cellular network traffic via the remote radio head based at least in part on the timing information;
  wherein the radio-frequency time-transfer signal comprises a pseudorandom number (PRN) stream having an identifiable epoch and wherein each given time module of the plurality of time modules comprises circuitry to supply a matching stream and circuitry to identify a timing offset as a function of synchronizing the matching stream with the PRN stream as received by the given time module.

2. The time transfer system of claim 1 wherein the time beacon to broadcast the radio-frequency time-transfer signal comprises a radio-frequency transmitter to transmit the time-transfer signal wirelessly using a carrier frequency of 5 GHz or less.

3. The time transfer system of claim 1 wherein the circuitry within the first time module to generate the timing information based at least in part on the radio-frequency time-transfer signal comprises a local clock generator to generate a local time signal and circuitry to synthesize the timing information based on the local time signal and the radio-frequency time-transfer signal received from the time beacon.

4. The time transfer system of claim 3 wherein the local clock generator comprises a microelectromechanical system (MEMS) structure that is one of a oscillator, a temperature compensated oscillator or an over-controlled oscillator, the local clock generator to generate the local time signal as a function of a resonant frequency of the MEMS structure.

5. The time transfer system of claim 1 wherein the plurality of time modules dispersed over the wide-field area comprise second and third time modules, the second time module disposed at least five miles from the first time module along a first axis and the third time module disposed at last five miles from the first time module along a second axis which is independent of the first axis.

6. The time transfer system of claim 1 wherein the remote radio head includes an enclosure and an antenna and wherein the first time module is mounted to the remote radio head of the cellular network antenna tower by at least one of disposition within the enclosure, mounting to an exterior surface of the enclosure, or mounting to the antenna.

7. The time transfer system of claim 1 wherein the remote radio head comprises circuitry to generate a carrier wave for wireless transmission of the cellular network traffic and wherein the first time module further comprises circuitry to adjust at least one of the frequency or the phase of the carrier wave based on the timing information.

8. The time transfer system of claim 1 wherein the circuitry within the first time module to time transmission of cellular network traffic via the remote radio head based at least in part on the timing information comprises circuitry to deliver the timing information to time-division-multiplexed (TDM) transmission circuitry within the remote radio head to enable definition of a continuous sequence of TDM timeslots in which the remote radio head transmits cellular network traffic.

9. The time transfer system of claim 1 wherein:
the time beacon is a first time beacon, the fixed terrestrial position is a first fixed terrestrial position, and the radio-frequency time-transfer signal is a first radio-frequency time transfer signal; and
the time transfer system further comprises at least one additional time beacon disposed at a respective additional fixed terrestrial position to broadcast a respective additional radio-frequency time-transfer signal.

10. A method of operating a time transfer system, the method comprising:
using a time beacon disposed at a fixed terrestrial position to broadcast a radio-frequency time-transfer signal; and
using a first time module mounted to a remote radio head of a cellular network antenna tower, the first time module having circuitry, to
receive the radio-frequency time-transfer signal,
generate timing information based at least in part on the radio-frequency time-transfer signal, and
time transmission of cellular network traffic via the remote radio head based at least in part on the timing information;
wherein the first time module is one of a plurality of time modules dispersed over a wide-field area spanned by the time-transfer signal broadcast; and
wherein the radio-frequency time-transfer signal comprises a pseudorandom number (PRN) stream having an identifiable epoch and wherein the method further comprises, within each given time module of the plurality of time modules, generating a matching stream and identifying a timing offset as a function of synchronizing the matching stream with the PRN stream as received by the given time module.

11. The method of claim 10 wherein the method comprises using a radio-frequency transmitter to transmit the time-transfer signal wirelessly in a manner having a carrier frequency of 5 GHz or less.

12. The method of claim 10 wherein the method further comprises generating a local time signal and synthesizing the timing information based on the local time signal and the radio-frequency time-transfer signal received from the time beacon.

13. The method of claim 12 wherein the method comprises generating the local time signal using a microelectromechanical system (MEMS) structure that is a part of the first time module and is one of a oscillator, a temperature compensated oscillator or an over-controlled oscillator, in a manner dependent on a resonant frequency of the M EMS structure.

14. The time transfer system of claim 10 wherein the plurality of time modules are dispersed over the wide-field area comprise second and third time modules, the second time module being disposed at least five miles from the first time module along a first axis and the third time module being disposed at last five miles from the first time module along a second axis independent from the first axis.

15. The method of claim 10 wherein the remote radio head includes an enclosure and an antenna and wherein method comprises mounting the first time module to the remote radio head of the cellular network antenna tower using at least one of disposition within the enclosure, mounting to an exterior surface of the enclosure, or mounting to the antenna.

16. The method of claim 10 further comprising generating a carrier wave for wireless transmission of the cellular network traffic and using circuitry within the first time module further to adjust at least one of the frequency or the phase of the carrier wave based on the timing information.

17. The method of claim 10 wherein the method comprises delivering the timing information to time-division-multiplexed (TDM) transmission circuitry within the remote radio head to enable definition of a continuous sequence of TDM timeslots in which the remote radio head is to transmit cellular network traffic.

18. The method of claim 10 wherein:
the time beacon is a first time beacon, the fixed terrestrial position is a first fixed terrestrial position, and the radio-frequency time-transfer signal is a first radio-frequency time transfer signal; and
the method further comprises using at least one additional time beacon disposed at a respective additional fixed terrestrial position to broadcast a respective additional radio-frequency time-transfer signal.

* * * * *